United States Patent
Zeng et al.

(10) Patent No.: US 9,559,331 B2
(45) Date of Patent: Jan. 31, 2017

(54) OLED PACKAGE METHOD AND OLED PACKAGE STRUCTURE

(71) Applicant: Shenzhen China Star Optoelectronics Technology Co., Ltd., Shenzhen, Guangdong (CN)

(72) Inventors: Weijing Zeng, Guangdong (CN); Yawei Liu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 43 days.

(21) Appl. No.: 14/426,374

(22) PCT Filed: Oct. 28, 2014

(86) PCT No.: PCT/CN2014/089615
§ 371 (c)(1),
(2) Date: Mar. 5, 2015

(87) PCT Pub. No.: WO2016/045163
PCT Pub. Date: Mar. 31, 2016

(65) Prior Publication Data
US 2016/0248041 A1    Aug. 25, 2016

(30) Foreign Application Priority Data
Sep. 22, 2014  (CN) .......................... 2014 1 0487732

(51) Int. Cl.
*H01L 51/52* (2006.01)
*H01L 27/32* (2006.01)
*H01L 51/56* (2006.01)

(52) U.S. Cl.
CPC ....... *H01L 51/5246* (2013.01); *H01L 27/3244* (2013.01); *H01L 51/56* (2013.01); *H01L 2227/323* (2013.01); *H01L 2251/301* (2013.01); *H01L 2251/303* (2013.01); *H01L 2251/558* (2013.01)

(58) Field of Classification Search
CPC .. H01L 51/5246; H01L 27/3244; H01L 51/56; H01L 2251/301; H01L 2251/303; H01L 2227/323
See application file for complete search history.

(56) References Cited

FOREIGN PATENT DOCUMENTS

| CN | 103165821 A | 6/2013 |
|---|---|---|
| CN | 104037363 A | 9/2014 |

*Primary Examiner* — Joseph L Williams
(74) *Attorney, Agent, or Firm* — Andrew C. Cheng

(57) ABSTRACT

The present invention provides an OLED package method and an OLED package structure. The method comprises steps of: step 1, providing a package cover plate (1), and a substrate (5), and the package cover plate (1) is formed with a spreading location (8) for spreading sealant (2); step 2, manufacturing a seal ring (7 or 7') on the package cover plate (1) outside the spreading location (8); step 3, spreading the sealant (1) in a round on the spreading location (8) of the package cover plate (1); step 4, oppositely attaching the package cover plate (1) and the substrate (5); step 5, employing an UV light source to irradiate and curing the sealant (2) to accomplish the package to the substrate (5) with the package cover plate (1).

11 Claims, 5 Drawing Sheets

OLED PACKAGE METHOD AND OLED PACKAGE STRUCTURE

FIELD OF THE INVENTION

The present invention relates to a display technology field, and more particularly to an OLED package method and an OLED package structure.

BACKGROUND OF THE INVENTION

In the display technology field, the flat panel display technologies, LCD (Liquid Crystal Display) and OLED (Organic Light Emitting Diode) have been gradually replaced the CRT (Cathode Ray Tube) displays. The flat light source technology is a new type light source and its skill development has been reached up for the mass production level of the market. In the flat panel display and flat light source technologies, the attachment of two sheet glasses is a very important skill. The package result directly influences the performance of the elements.

The ultra-violet light curing technology is the most earliest and most common skill employed for the LCD/OLED packages. It possesses properties below: no solvent or little solvent is required, which diminishes the pollution of the solvent to the environment; the energy consumption is less and low temperature curing is possible which is suitable for heat sensitive material; the curing speed is fast and efficiency is high which can be applied to the high speed production line. The occupied space of the curing apparatus is small. Nevertheless, the UV glue is organic material. The molecular clearance after curing becomes larger. The water vapor and the oxygen can easily pass through the media and reach to the inside of the sealed space. Therefore, the technology should be suitable for the application field which is not sensitive to the water vapor and the oxygen, such as LCD. The OLED elements are highly sensitive to the water vapor and the oxygen. When the UV package is applied, dryer can be generally arranged inside the elements to eliminate the water vapor passing through the media and reach the inside of the sealed space for extending the usage lifetime of the OLED elements.

The main research target of the present UV package for the OLED is to seek the UV glue with the lower permeability of the water vapor. This demands that the accumulation of the UV glue organic molecules gets more compacted after curing. Accordingly, the permeating path of the water vapor among the molecules becomes narrower. The permeability of the water vapor gets smaller.

Frit package technology is a new type panel glass package skill under development now. In China, almost no related documents are published. It is to mix the glass powder to be a solution with a certain viscosity. The solution is coated on the package glass and heated to remove the solvent. Then, after the glasses to be package have been attached, the laser is activated to burn and melt the frit glass powder instantly. Ultimately, the two sheet glasses are attached and bonded together. The Frit skill uses the inorganic package media. Therefore, the capability of resisting water vapor and oxygen is so strong. For now, the skill patents of the frit package are monopolized by only few foreign companies.

Mostly, the present UV package method of OLED is merely coating the UV glue on the surface of the package cover plate, and then, the package cover plate is oppositely attached to the TFT substrate. With the UV light irradiation, the UV glue is solidified. Thereby, the package of the TFT substrate with the package cover plate is accomplished.

However, the OLED element on the TFT substrate is highly sensitive to the water vapor and the oxygen. The capability of the present UV package method to resist the water vapor and the oxygen is so poor that the arrangement of the dryer is required to reduce the water vapor that pass through the UV glue and reaches to the inside of the sealed space and to extends the usage lifetime of the OLED element. Nevertheless, the present UV package method only can be applicable to the bottom emitting OLED element structure. The package result of the Frit package good but the process is complicated and the equipment is amazingly expensive.

SUMMARY OF THE INVENTION

An objective of the present invention is to provide an OLED package method, capable of improving the package result to raise the capability of resisting water vapor and oxygen, and to extend the usage lifetime of the OLED element.

Another objective of the present invention is to provide an OLED package structure, and the package result of the OLED package structure is well and capable of resisting water vapor and oxygen. Because the package structure does not use dryer, and therefore suitable for all OLED elements of bottom emitting, top emitting and double display.

For realizing the aforesaid objective, the present invention provides an OLED package method, comprising steps of:

step 1, providing a package cover plate, and a substrate, and the package cover plate is formed with a spreading location for spreading sealant;

step 2, manufacturing a seal ring on the package cover plate outside the spreading location;

step 3, spreading the sealant in a round on the spreading location of the package cover plate;

step 4, oppositely attaching the package cover plate and the substrate; step 5, employing an UV light source to irradiate and curing the sealant to accomplish the package to the substrate with the package cover plate.

The package cover plate is a glass plate and the substrate is a TFT substrate with an LED element.

In the step 2, a distance between an outer edge of the seal ring close to the spreading location and a central line of the spreading location is 0.5 mm-2.5 mm.

A width of the seal ring is 20 μm-2000 μm, and a height thereof is 3 μm-50 μm, and the seal ring on the same package cover plate has consistent width and height at different locations.

The seal ring is an inorganic isolation thin film; material of the inorganic isolation thin film is $SiO_2$ or $SiNx$, and the inorganic isolation thin film is acquired by implementing chemical vapor deposition for film formation, and then etching.

The seal ring is a structure of arranging an inorganic isolation thin film on a metal layer; the manufacture method of the structure is: first, forming a metal layer in a round on the package cover plate outside the spreading location, and then forming the inorganic isolation thin film in a round on the metal layer and corresponding to the metal layer; the metal layer is molybdenum, and material of the inorganic isolation thin film is $SiO_2$ or $SiNx$, and the inorganic isolation thin film is acquired by implementing chemical vapor deposition for film formation, and then etching.

In the step 3, the sealant is UV glue, and a height of the sealant is larger than a height of the seal ring.

In the step 4, a width of the sealant is 1 mm-5 mm after the package cover plate and the substrate are oppositely attached.

The present invention further provides an OLED package structure, comprising a package cover plate, a substrate tight attached with the package cover plate, sealant located between the package cover plate and the substrate and a seal ring outside the sealant.

The seal ring is an inorganic isolation thin film in a round, or a structure of arranging an inorganic isolation thin film on a metal layer.

The benefits of the present invention are: the OLED package method of the present invention is simple and practicable, and the operability is high, which combines the advantages of UV package and frit package. By arranging an inorganic isolation thin film in a round on the package cover plate, and the inorganic isolation thin film is located outside the sealant to be utilized for resisting the water vapor. Accordingly, the package result can be significantly improved to raise the capability of resisting water vapor and oxygen, and to extend the usage lifetime of the OLED element. Meanwhile, the package result of the OLED package structure provided by the present invention is well and capable of resisting water vapor and oxygen. Because the package structure does not use dryer, and therefore is suitable for all OLED elements of bottom emitting, top emitting and double display.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution, as well as beneficial advantages, of the present invention will be apparent from the following detailed description of an embodiment of the present invention, with reference to the attached drawings.

In drawings.

DETAILED DESCRIPTION OF PREFERRED EMBODIMENTS

Figure 1:
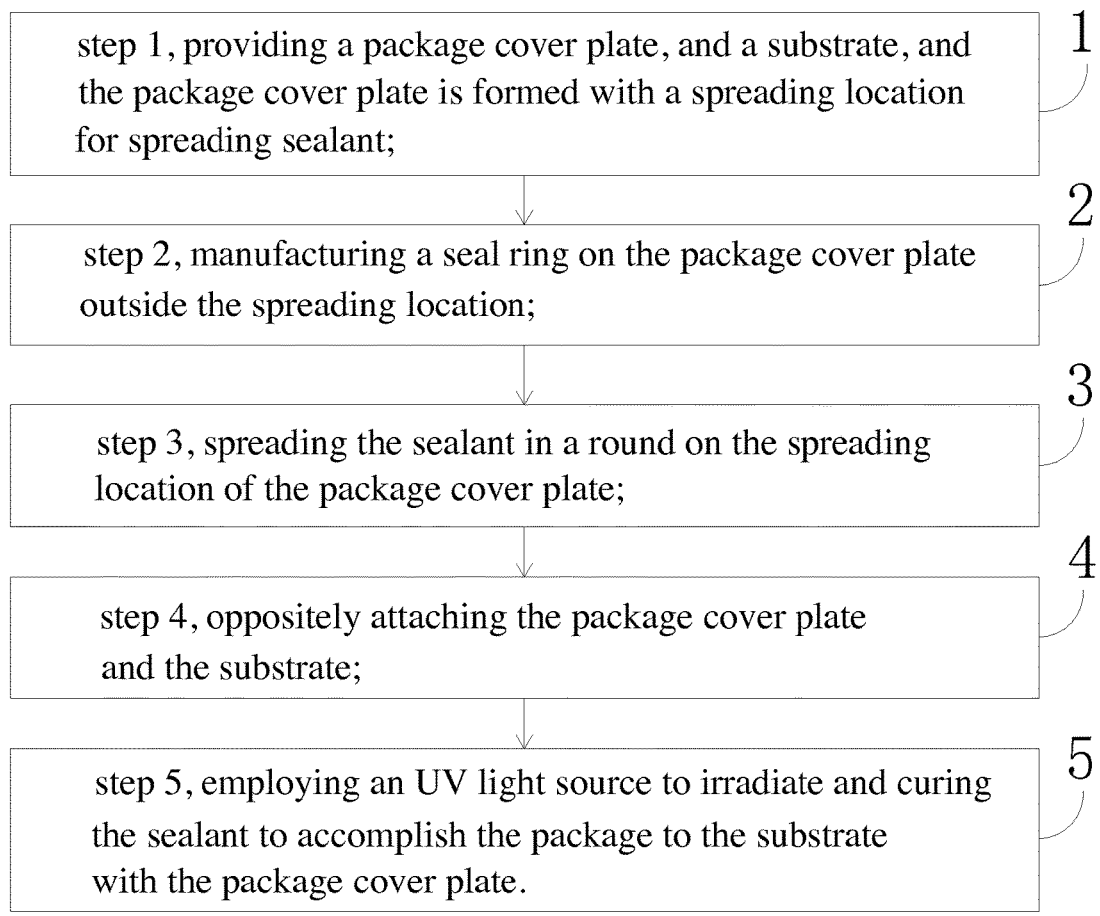
FIG. 1 is a flowchart of an OLED package method according to the present invention.

Embodiments of the present invention are described in detail with the technical matters, structural features, achieved objects, and effects with reference to the accompanying drawings as follows.

Please refer from FIG. 1 to FIG. 7. The present invention provides an OLED package method, comprising steps of:

step 1, providing a package cover plate 1, and a substrate 5.

Preferably, the package cover plate 1 is a glass plate. Preferably, the substrate 5 is a TFT substrate with an LED element 6.

Figure 2:
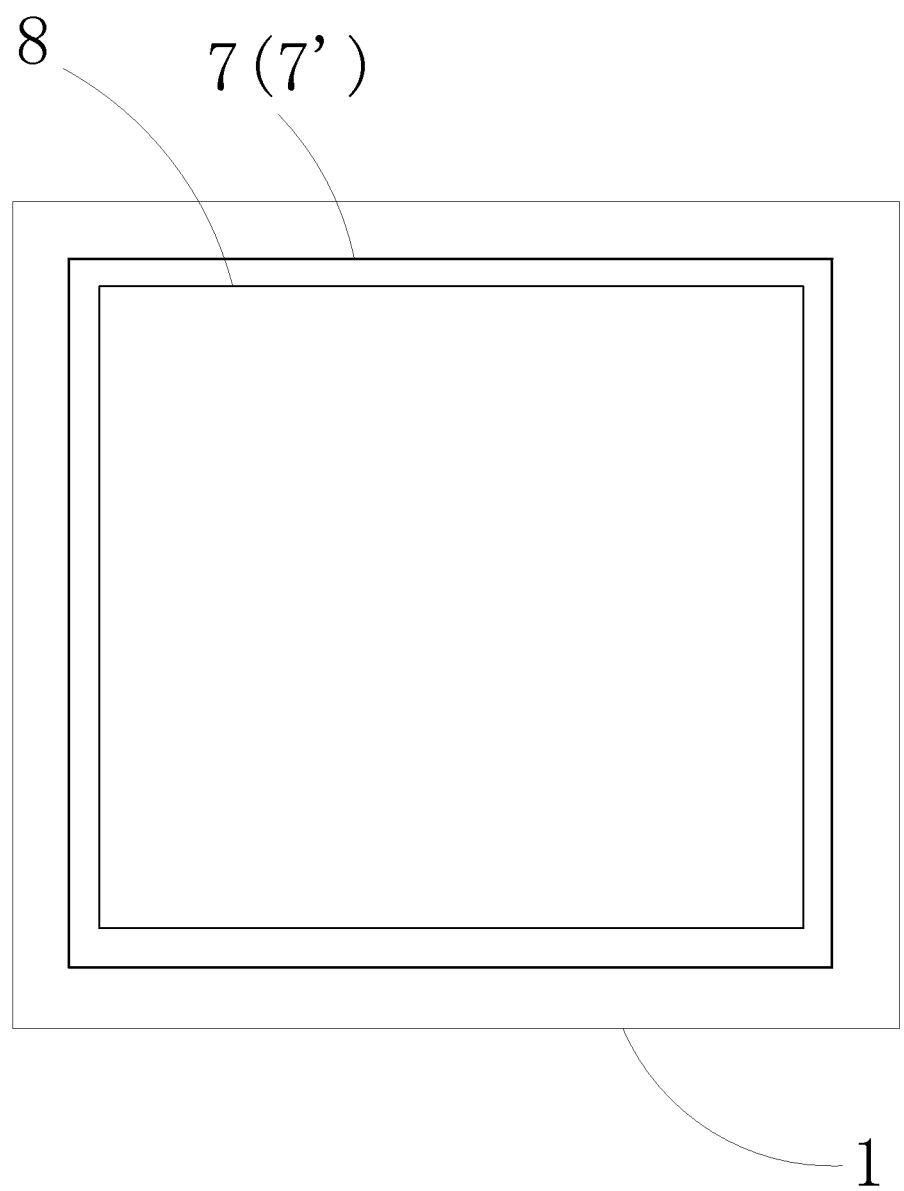
FIG. 2 is a top view diagram of step 2 of an OLED package method according to the present invention.

Specifically, the package cover plate 1 is formed with a spreading location 8 for spreading sealant 2.

step 2, as shown in FIG. 2, manufacturing a seal ring 7 (7') on the package cover plate 1 outside the spreading location 8.

Figure 3:
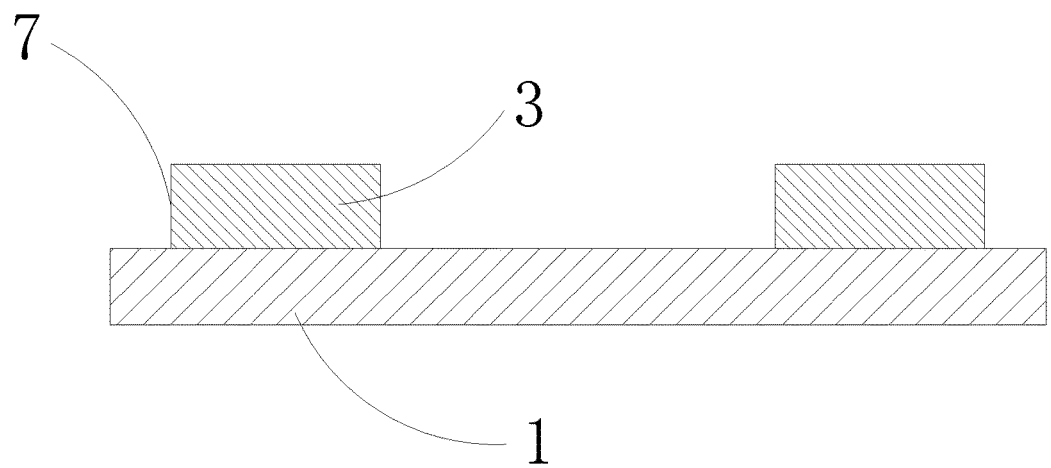
FIG. 3 is a sectional diagram of seal ring 7 manufactured in step 2 of an OLED package method according to the present invention.

Specifically, as shown in FIG. 3, the seal ring 7 can be an inorganic isolation thin film 3 in a round.

Specifically, the inorganic isolation thin film 3 is acquired by implementing CVD (Chemical Vapor Deposition) for film formation, and then etching outside the spreading location 8.

Preferably, material of the inorganic isolation thin film 3 is $SiO_2$ or SiNx.

Figure 4:
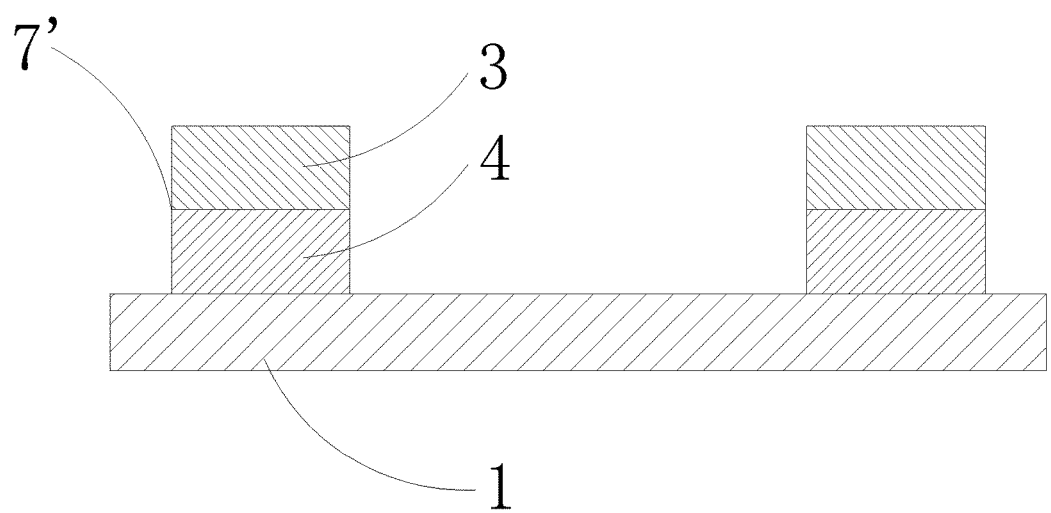
FIG. 4 is a sectional diagram of seal ring 7' manufactured in step 2 of an OLED package method according to the present invention.

Alternatively, as another possible technical solution, as shown in FIG. 4, the seal ring 7' can be a structure of arranging an inorganic isolation thin film 3 on a metal layer 4; the manufacture method of the structure is: first, forming a metal layer 4 in a round on the package cover plate 1 outside the spreading location 8, and then forming the inorganic isolation thin film 3 in a round on the metal layer 4 and corresponding to the metal layer 4.

Preferably, the metal layer 4 is molybdenum, and the inorganic isolation thin film 3 is acquired by implementing CVD (Chemical Vapor Deposition) for film formation, and then etching. Preferably, material of the inorganic isolation thin film 3 is $SiO_2$ or SiNx.

Preferably, a width of the seal ring is 20 μm-2000 μm, and a height thereof is 3 μm-50 μm, and the seal ring 7 (7') on the same package cover plate 1 has consistent width and height at different locations. Preferably, a distance between an outer edge of the seal ring 7 (7') close to the spreading location 8 and a central line of the spreading location 8 is 0.5 mm-2.5 mm.

Figure 5:
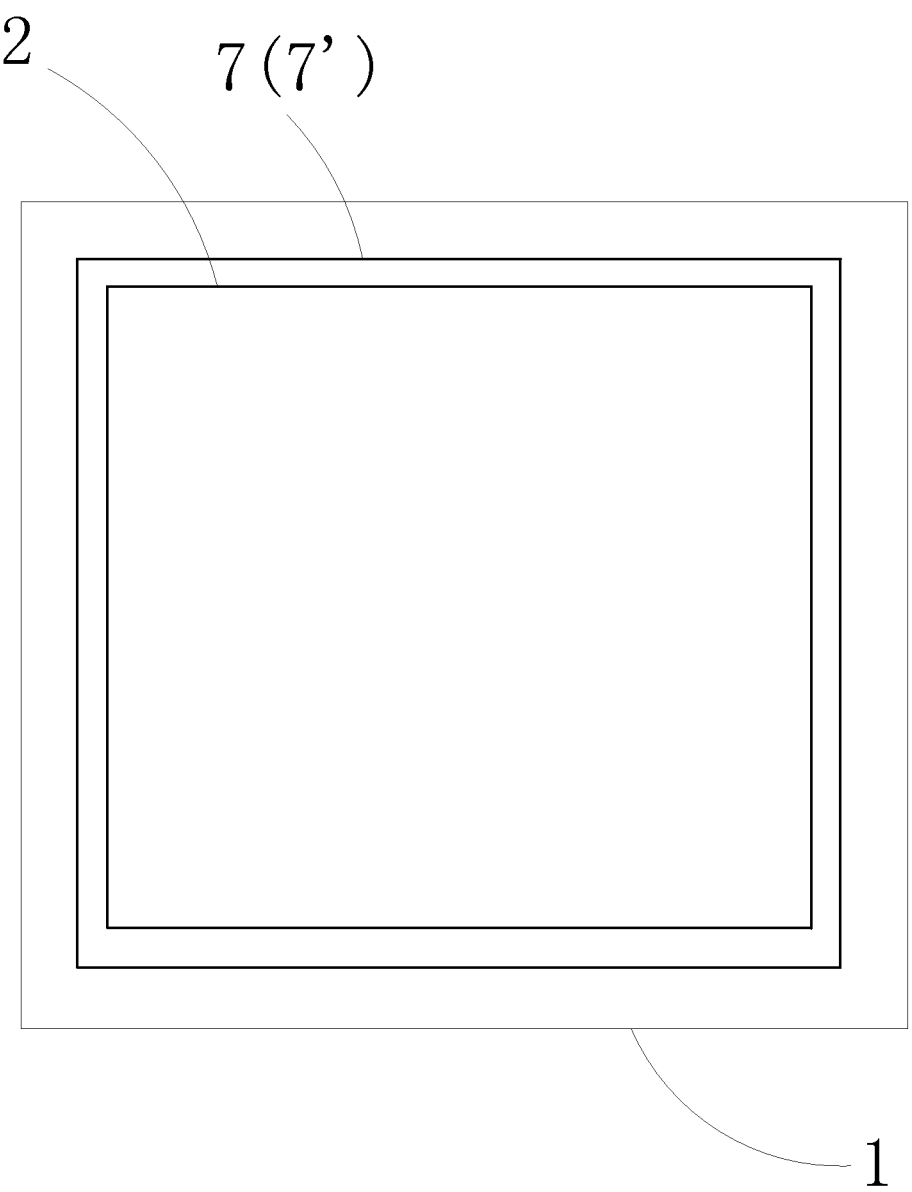
FIG. 5 is a top view diagram of step 3 of an OLED package method according to the present invention.
Figure 6:
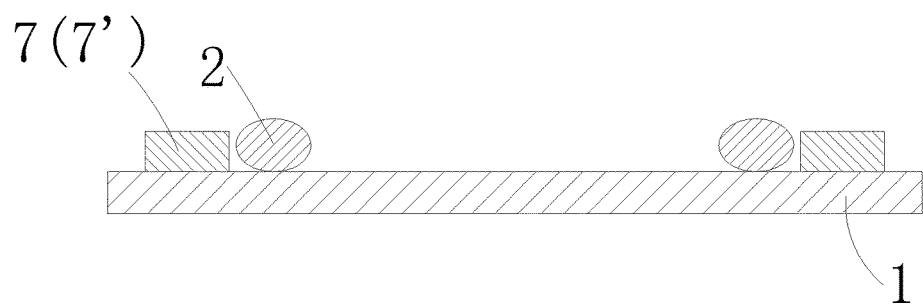
FIG. 6 is a sectional diagram of step 3 of an OLED package method according to the present invention.

The seal ring 7 (7') is arranged outside the spreading location 8 to function for blocking the water vapor and oxygen. Accordingly, the package result can be significantly improved to extend the usage lifetime of the OLED element. The present invention does not demand dryer and therefore is suitable for all OLED elements of bottom emitting, top emitting and double display.

step 3, as shown in FIG. 5 and FIG. 6, spreading the sealant 2 in a round on the spreading location 8 of the package cover plate 1.

Specifically, a height of the sealant 2 is larger than a height of the seal ring 7 (7').

Under control of the spreading amount of the sealant 2, a width of the sealant 2 is 1 mm-5 mm after the package cover plate 1 and the substrate 5 are oppositely attached.

Preferably, the sealant 2 is UV glue.

step 4, oppositely attaching the package cover plate 1 and the substrate 5.

The width of the sealant 2 is 1 mm-5 mm after the package cover plate 1 and the substrate 5 are oppositely attached.

step 5, employing an UV light source to irradiate and curing the sealant 2 to accomplish the package to the substrate 5 with the package cover plate 1.

Figure 7:
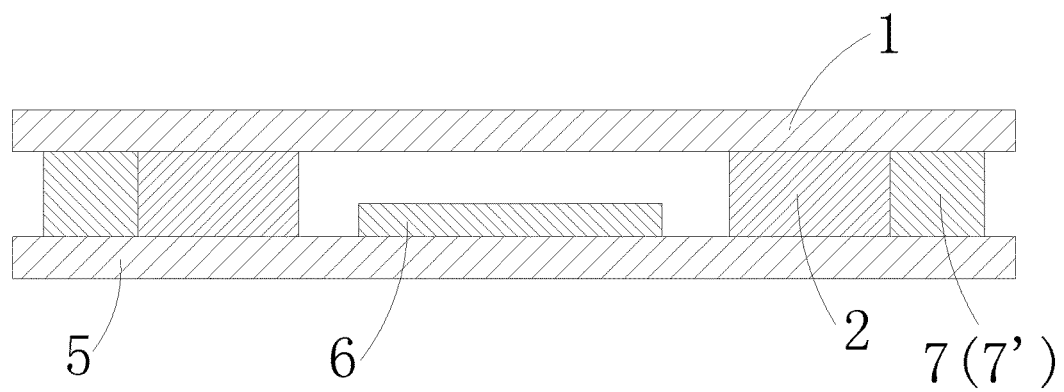
FIG. 7 is a sectional diagram of step 5 of an OLED package method according to the present invention.

As shown in FIG. 7, on the basis of the aforesaid package method, the present invention further provides an OLED package structure, comprising a package cover plate 1, a substrate 5 tight attached with the package cover plate 1, sealant 2 located between the package cover plate 1 and the substrate 5 and a seal ring 7 (7') outside the sealant 2.

Preferably, the package cover plate 1 is a glass plate. The substrate 5 is a TFT substrate with an LED element 6. The sealant 2 is UV glue.

Preferably, the width of the sealant 2 is 1 mm-5 mm, and the distance between an outer edge of the seal ring 7 (7') close to the spreading location 8 and a central line of the spreading location 8 is 0.5 mm-2.5 mm.

The seal ring 7 (7') can be an inorganic isolation thin film 3 in a round.

Alternatively, as another possible technical solution, the seal ring 7' can be a structure of arranging an inorganic isolation thin film 3 on a metal layer 4. Preferably, the material of the inorganic isolation thin film 3 is $SiO_2$ or SiNx, and the metal layer 4 is molybdenum.

In conclusion, the OLED package method of the present invention is simple and practicable, and the operability is high, which combines the advantages of UV package and frit package. By arranging an inorganic isolation thin film in a round on the package cover plate, and the inorganic isolation thin film is located outside the sealant to be utilized for resisting the water vapor. Accordingly, the package result can be significantly improved to raise the capability of resisting water vapor and oxygen, and to extend the usage lifetime of the OLED element. Meanwhile, the package result of the OLED package structure provided by the present invention is well and capable of resisting water vapor and oxygen. Because the package structure does not use dryer, and therefore is suitable for all OLED elements of bottom emitting, top emitting and double display.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An organic light emitting diode (OLED) package method, comprising steps of:
   step 1, providing a package cover plate and a substrate, wherein the package cover plate is formed with a spreading location for spreading sealant;
   step 2, manufacturing a seal ring on the package cover plate outside the spreading location, wherein the seal ring is formed of an inorganic material or a combination of an inorganic material and a metal material;
   step 3, spreading the sealant in a round on the spreading location of the package cover plate such that the sealant is located inboard of the seal ring;
   step 4, oppositely attaching the package cover plate and the substrate;
   step 5, employing ultraviolet (UV) light source to irradiate and cure the sealant to accomplish the package to the substrate with the package cover plate.

2. The OLED package method according to claim 1, wherein the package cover plate is a glass plate and the substrate is a TFT substrate with an LED element.

3. The OLED package method according to claim 1, wherein in the second step, a distance between an outer edge of the seal ring close to the spreading location and a central line of the spreading location is 0.5 mm-2.5 mm.

4. The OLED package method according to claim 1, wherein a width of the seal ring is 20 µm-2000 µm, and a height thereof is 3 µm-50 µm, and the seal ring on the same package cover plate has consistent width and height at different locations.

5. The OLED package method according to claim 1, wherein the seal ring is an inorganic isolation thin film; material of the inorganic isolation thin film is $SiO_2$ or SiNx, and the inorganic isolation thin film is acquired by implementing chemical vapor deposition for film formation, and then etching.

6. The OLED package method according to claim 1, wherein the seal ring is a structure of arranging an inorganic isolation thin film on a metal layer; the manufacture method of the structure is: first, forming a metal layer in a round on the package cover plate outside the spreading location, and then forming the inorganic isolation thin film in a round on the metal layer and corresponding to the metal layer; the metal layer is molybdenum, and material of the inorganic isolation thin film is $SiO_2$ or SiNx, and the inorganic isolation thin film is acquired by implementing chemical vapor deposition for film formation, and then etching.

7. The OLED package method according to claim 1, wherein in the third step, the sealant is UV glue, and a height of the sealant is larger than a height of the seal ring.

8. The package method of the OLED panel according to claim 1, wherein in the fourth step, a width of the sealant is 1 mm-5 mm after the package cover plate and the substrate are oppositely attached.

9. An organic light emitting diode (OLED) package structure, comprising a package cover plate, a substrate tightly attached to the package cover plate, sealant located between the package cover plate and the substrate and a seal ring outside the sealant, wherein the seal ring is formed of an inorganic material or a combination of an inorganic material and a metal material and the sealant is located inboard of the seal ring.

10. The OLED package structure according to claim 9, wherein the seal ring is an inorganic isolation thin film in a round, or a structure of arranging an inorganic isolation thin film on a metal layer.

11. An organic light emitting diode (OLED) package structure, comprising a package cover plate, a substrate tightly attached to the package cover plate, sealant located between the package cover plate and the substrate and a seal ring outside the sealant, wherein the seal ring is formed of an inorganic material or a combination of an inorganic material and a metal material and the sealant is located inboard of the seal ring;
   wherein the seal ring is an inorganic isolation thin film in a round, or a structure of arranging an inorganic isolation thin film on a metal layer.

* * * * *